United States Patent [19]
Bates et al.

[11] Patent Number: 5,199,882
[45] Date of Patent: Apr. 6, 1993

[54] ELASTOMERIC WIRE TO PAD CONNECTOR

[75] Inventors: Warren A. Bates, Winston-Salem; Frederick R. Deak, Kernersville; David C. Johnson, Winston-Salem; Keith L. Volz, Jamestown, all of N.C.

[73] Assignee: AMP Incorporated, Harrisburg, Pa.

[21] Appl. No.: 854,111

[22] Filed: Mar. 19, 1992

[51] Int. Cl.$^5$ .............................................. H01R 9/03
[52] U.S. Cl. .................................... 439/67; 439/66
[58] Field of Search ..................... 439/66, 67, 77, 91

[56] References Cited

U.S. PATENT DOCUMENTS 4,057,311 11/1977 Evans ..................................... 439/67
4,740,165 4/1988 Tomino et al. ........................ 439/67

Primary Examiner—Gary F. Paumen

[57] ABSTRACT

Component package (10) includes component (24) having conductive pads (26) attached to the lid (20) of a housing (30) containing wires (14) of a cable (12) positioned therewithin to be engaged by an elastomeric connector (42) having a resilient core (44) with a thin, dielectric film (46) carrying conductive traces (48) extending over a tab (50) with the housing and lid driving the pads against the connector to interconnect the pads to the traces to the wires upon closure. In one embodiment, the wires (14) are solder coated (16) with a solder reflow effecting a tab to wire connection and in another embodiment, precious metal coatings are employed to allow pressure connection between wire and traces. Alternatively, coatings of conductive inks or conductive adhesives may be used. The conductive traces may be placed on centers appropriate to the particular centers in the array of conductive pads and in the array of wires, such centers being selectively varied.

15 Claims, 6 Drawing Sheets

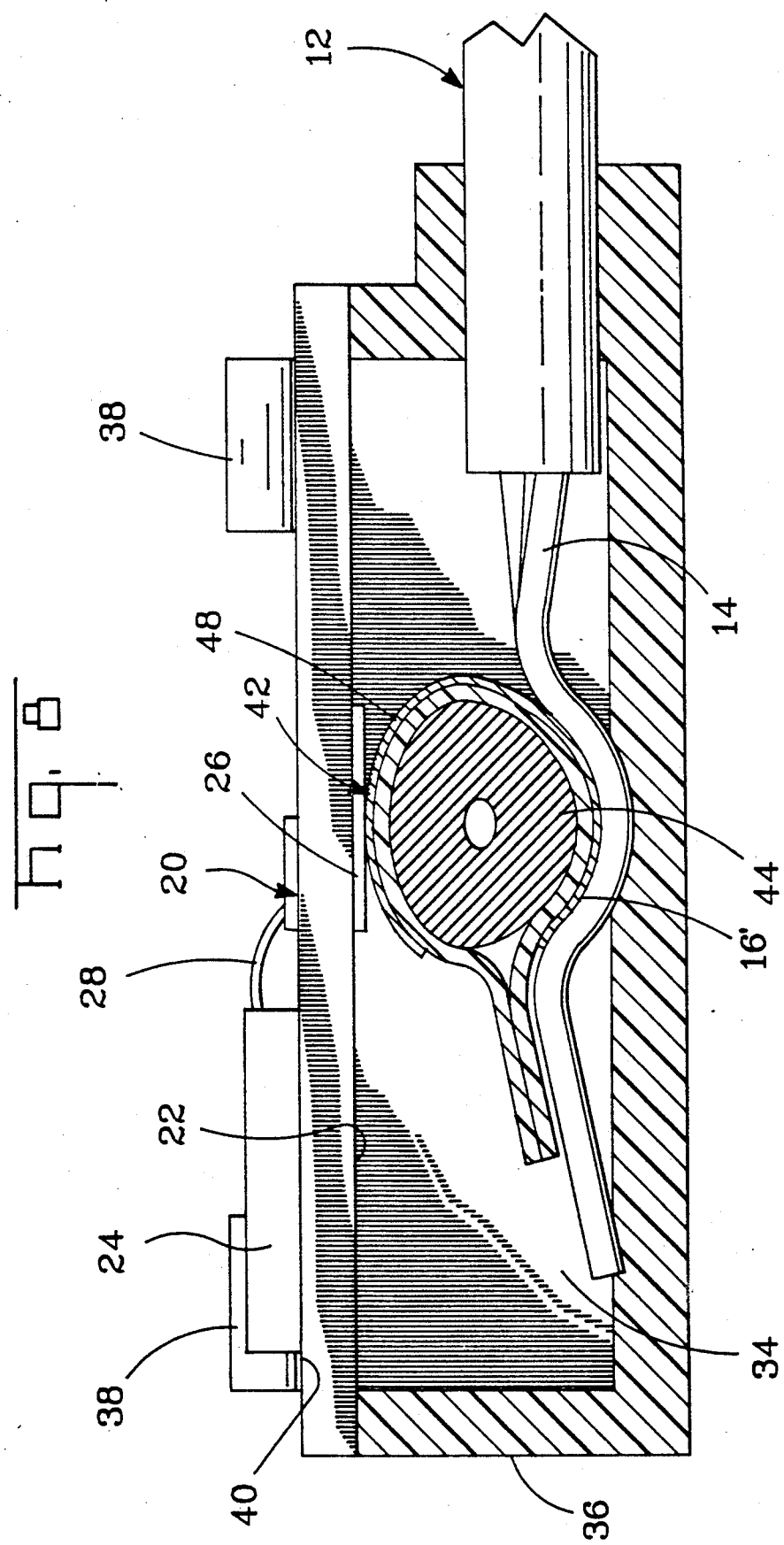

ELASTOMERIC WIRE TO PAD CONNECTOR

This invention relates to an electrical connector wherein electrical wires are interconnected to the planar pads associated with an electrical component.

BACKGROUND OF THE INVENTION

Manufacturing processes used to make sensor and transducer components, particularly solid state components, dictate component package geometries having arrays of thin, deposited conductive pads defining the electrical circuits for such components. Interconnection of such components frequently dictates the use of electrical cable having conductive wires of a solid or stranded and rounded configuration; occasionally of a flat, ribbon configuration. Termination of these wires to the component pads is typically done through connectors utilizing special termination techniques between the wires and the connector, through pressure connections or solder, with a further termination from the connector to the component. The trend toward miniaturization allowed by solid state technology has yielded component, connector packages where the connector is much larger than the component. Additionally, the small sizes of miniaturized parts, component, connector, and cable, makes for a manufacture and assembly that is costly and difficult.

Accordingly, it is an object of the present invention to provide an improved wire to pad interconnection. It is a further object to provide a wire to pad connector that is easy to use, allows a ready separable connection between components and cable. It is still a further object to provide a miniaturized elastomeric connector for use in interconnecting components and the conductive paths thereof to cables and the wires thereof.

SUMMARY OF THE INVENTION

The invention achieves the foregoing objects by providing an interconnection between the flat, planar pads of a component, such as a sensor or transducer, in the form of an integrated circuit, and the wires of a cable that carry power and electrical signals to and from such component. In one embodiment, the invention utilizes a housing having a lid upon which the component is mounted, along with a conductive pad interconnected to the component and extending on an inside surface of the lid in a given pattern on given center-to-center spacings. The housing further includes a box-like structure having a floor and side walls with latches projecting upwardly to receive and latch the lid to the structure forming a closed body defining an interior cavity. An electrical cable is extended through the housing into the cavity with wires positioned therein in a given pattern on certain centers, held in the floor of the structure. An elastomeric connector is provided, which includes a thin, dielectric and flexible film having conductive traces formed thereon as by etching away copper foil, suitably plated with a non-oxidizing coating, wrapped around an elastomeric core formed of a non-conducting resilient material. The dimensions of the elastomeric connector, including the spacing of the conductive tracings, are made to be aligned with the pads connected to the component and with the wires fitted within the housing in a manner so that the connector is compressed when the lid is latched to the lower structure of the housing. The resilient characteristics of the core of the connector and the dimensions of the connector are chosen to provide a compression thereof sufficient to drive the conductive traces of the film into engagement with the pads and with the wires to, in one embodiment, interconnect the pads to the wires with a stable, low-resistance, and disconnectable interconnection. In another embodiment, the film of the connector is made to include a tab portion carrying the traces into position with a reflowable solder material applied to the wires being caused to reflow to solder the wires to the traces on the tab of the connector. In another embodiment, it is contemplated that the solderable material may be applied to the traces on the tab of the connector with suitable reflow to the wires, the elastomeric connection being, in either event, made to the pads interconnected to the component on the lid of the device. In still a further embodiment, the conductive traces on the connector are provided on a pattern complementary to the pattern of the pads, common centers, on one end of the film, to be positioned on the top of the connector, with the traces being on different centers in a different pattern on the other end of the film to accommodate wires placed on different centers or, in a different pattern within the housing of the connector. In yet a further embodiment, it is contemplated that the film of the connector may be made to include a tab that extends well away from the elastomeric core to facilitate different positionings of the connector within housings than that shown.

IN THE DRAWINGS

FIG. 8 is a side, elevational and partially sectioned view, similar to FIG. 5, illustrating a solderless embodiment of this invention.

DETAILED DESCRIPTION OF THE INVENTION

Figure 1:
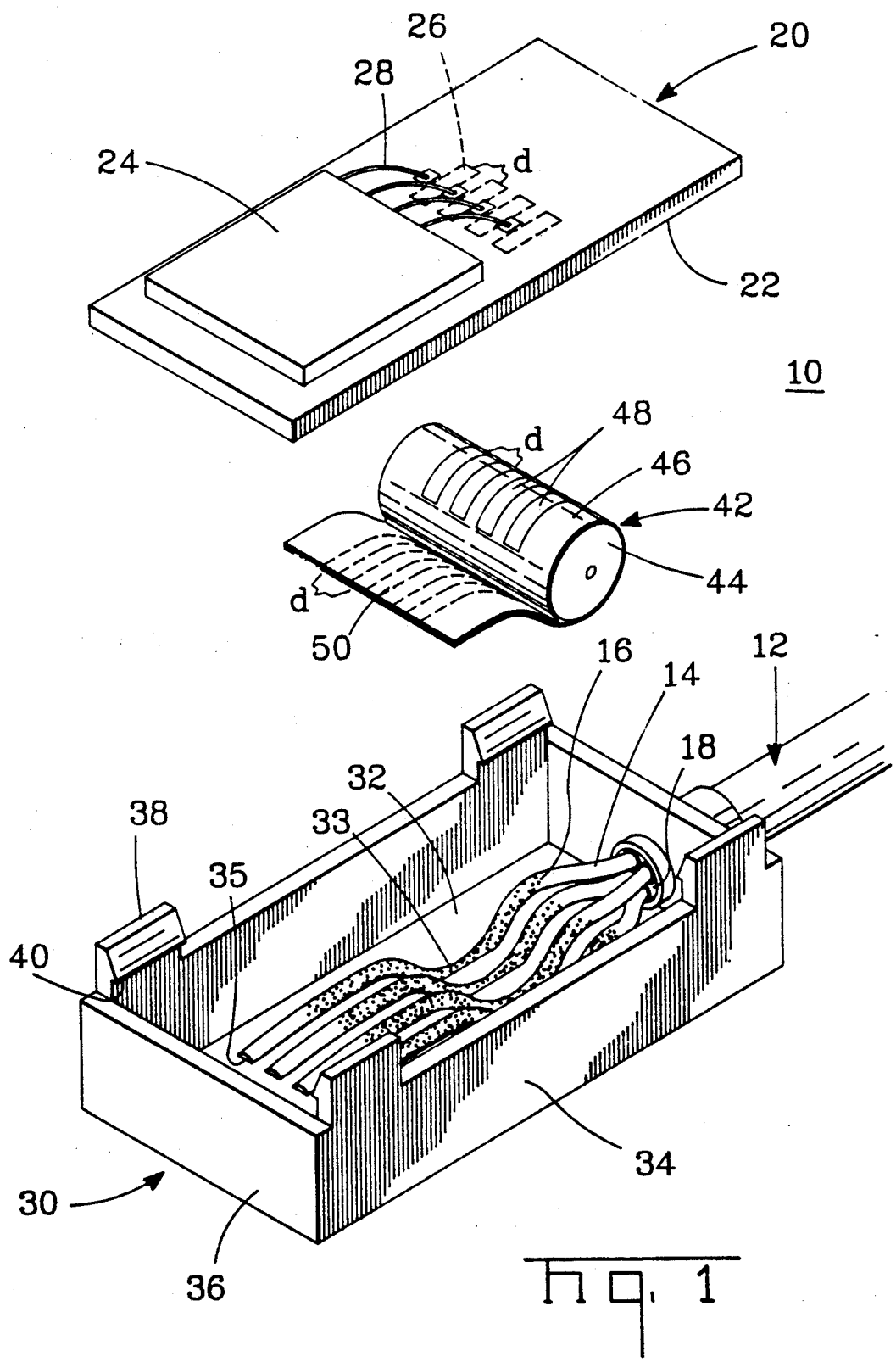
FIG. 1 is a perspective showing the elements of the invention assembly in an exploded view.

Referring first to FIG. 1, a component package 10 is illustrated, including an electrical cable 12, a portion of a housing including a lid 20, and a housing structure 30. The lid 20 carries component 24 which may be considered to be a sensor or transducer 24 desirably interconnected to the cable 12. Components of the type under consideration are widely used in the many fields where there is a need to measure parameters and develop signals representative of such parameters. For example, in the medical field, solid state sensors and transducers are widely utilized to measure pressures related to blood flow, heart rate, and the like, with signals developed to record the dynamic status of such parameters for monitoring and diagnosis of medical condition. Similar components are utilized throughout the industrial field to measure a host of parameters necessary to monitor or control machine functions, processes, to count, measure, and develop processing data.

Components are typically planar in configuration, including substrates formed of a variety of insulating package materials, such as plastic or ceramic, with the active component connected to exterior leads and pads that conduct power to the component and signals to and from the component which are indicative of function.

Figure 4:
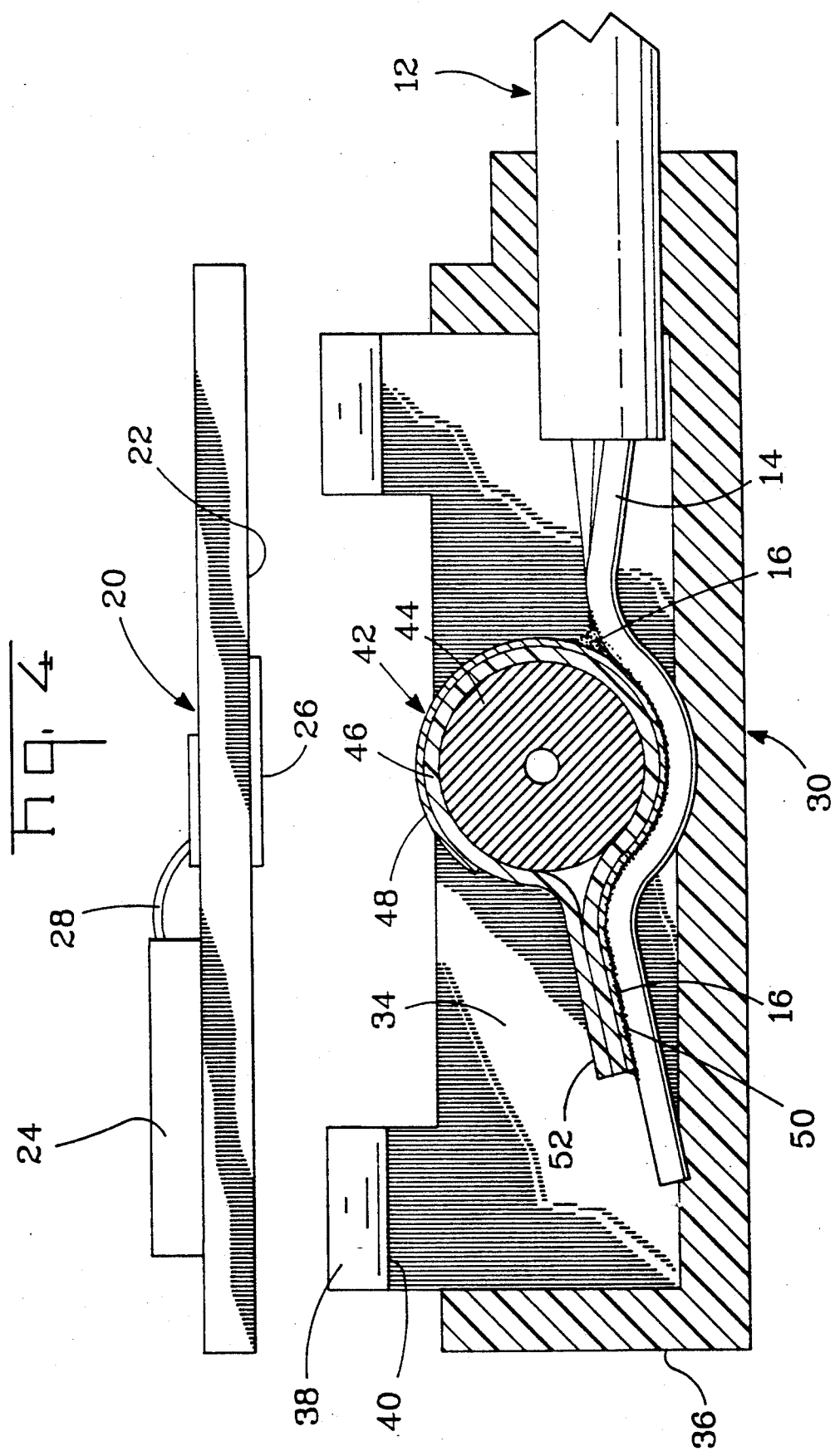
FIG. 4 is a side, elevational, and partially sectioned view of the elements of the invention and the relationship of elements shown in FIG. 2.

Power and signals are typically represented by voltage levels related to currents in analog or digital form, representative of dynamic variations in signal. These currents are carried by a cable, such as 12, through wires 14, insulated each from the other by separate insulating sleeves 18 as shown in FIG. 1. The invention contemplates an interconnection of the wires 14 to component 24 through conductive pads 26 and conductive leads 28. FIG. 4 shows the arrangement of 24, 26, and 28 on the surface 22 of lid 20. In practice, a component 24 may be considered to contain therewithin an active solid state device within a plastic or ceramic housing with the leads 28 extended therefrom and joined to conductive pads 26 formed on the surface 22 of lid 20 on centers d. The invention fully contemplates that the component 24 may include conductive traces thereon, similar to the pads 26 with the outside profile of component 24 forming the lid itself.

As can be seen in FIG. 1, the invention includes a housing 30 having a floor 32, side walls 34, end walls 36 integrally formed as by a molding of plastic material. Projections 38 extend upwardly from the side walls and include interiorly directed latch surfaces 40 that receive, engage, and latch the lid 20 down onto the housing 30 in the manner shown in FIGS. 2 and 5. The interior of housing 30 includes a cavity 32 into which is fitted the wires 14 of cable 12. Suitable means, such as an adhesive, are employed to fasten and seal the cable 12 to housing 30. The floor 32 of the housing includes a series of recesses 33 and 35, as shown in FIG. 1, that position the wires 14 relative to the housing and hold the wires in place in a given pattern and on predetermined center spacings d. Also shown in FIG. 1 is a connector 42 of the elastomeric type, including a center core 44 of a resilient, insulating material such as silicon or a foamed polyurethane having a thin film 46 wrapped therearound. The film 46 is typically an imide or a polyamid, preferably of a type that can withstand temperatures utilized in solder reflow, temperatures on the order of 400 to 500 degrees Fahrenheit, used with solders having reflow temperatures on the order of 360 degrees Fahrenheit. The film 46 is additionally made flexible to accommodate bending and the wrapping indicated in the package configuration in FIG. 1. The film further includes a series of conductive traces, typically formed by etching away copper foil that is subsequently coated, as by plating, with appropriate finishes. The traces 48 extend around the connector body, core 44, to define a tab 50 extending out from the body of the connector. Elastomeric connectors are well known, and reference is made to U.S. Pat. No. 4,057,311, issued Nov. 8, 1977, for a teaching of the type of elastomeric connectors here contemplated. These connectors function by being compressed by the circuits intended to be interconnected with the resiliency of the core such as 44 sufficient to drive the conductive traces 48 against the circuits to be interconnected with sufficient normal force to define a low-resistance, stable electrical interface. As can be discerned from FIG. 1, the traces 48 are on centers d complementary to the centers of pads 26 and the centers of the wires 14.

Figure 2:
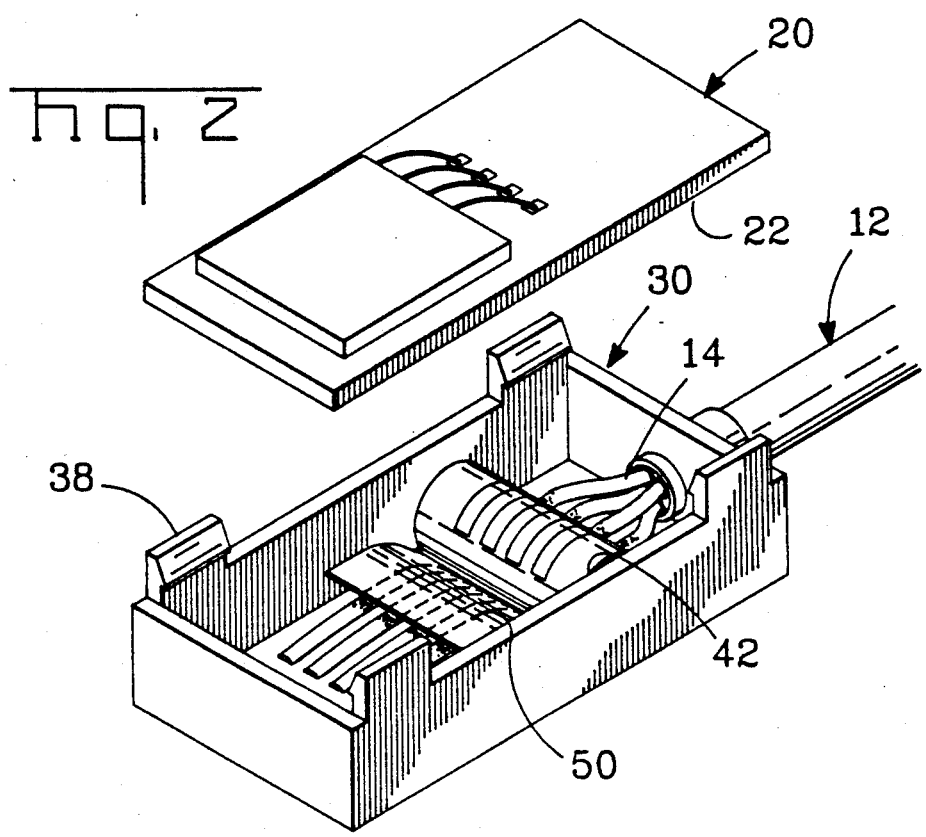
FIG. 2 is a perspective showing the elements shown in FIG. 1 with the connector installed in a housing, the lid of the housing uninstalled.
Figure 3:
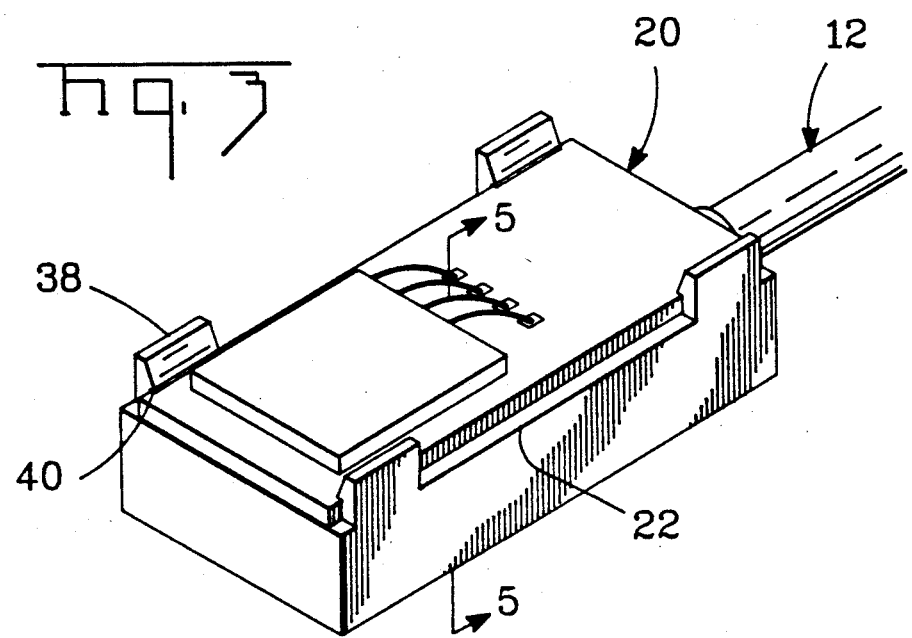
FIG. 3 is a perspective view showing the elements of FIG. 1 and 2 fully assembled.
Figure 5:
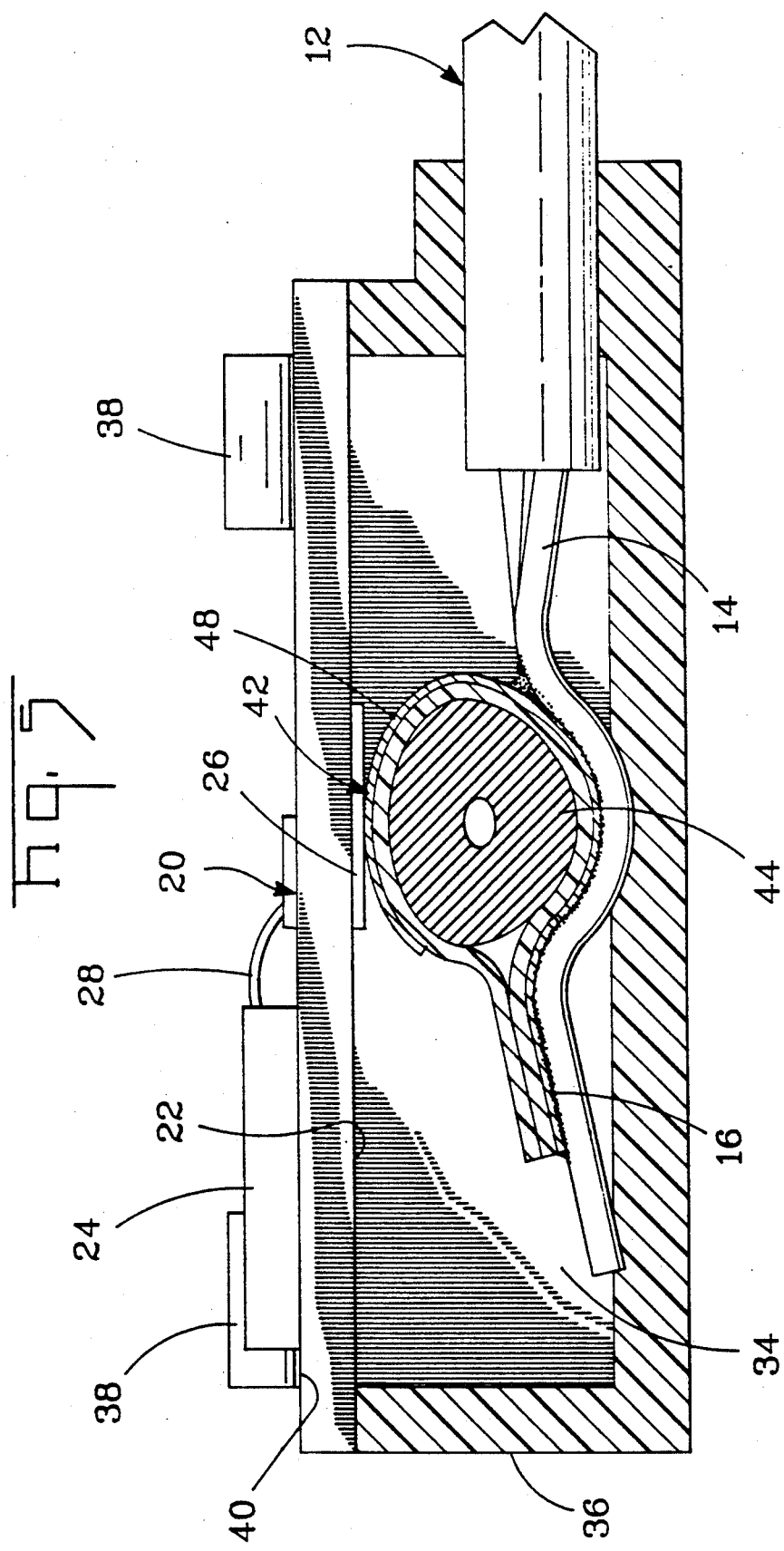
FIG. 5 is a side, elevational and partially sectioned view of the assembled elements of FIG. 3.

In accordance with the invention, the connector 42 is placed within housing 30 as shown in FIG. 2, with the lid 20 brought down to fit against housing 30 and be latched thereby through the engagement of the latching surfaces 40 of projections 38 in the manner shown in FIG. 3. The engagement, compressing connector 42 and the wires 14 and pads 26, is shown in FIG. 5. In accordance with one embodiment of the invention, the wires 14 are given a coating as by plating, either along the wire length or selectively near the ends, as shown in FIG. 1, of a reflowable solder-type material, such as a tin lead or composition widely used to effect solder interconnections. In this embodiment, connector 42 is placed within housing 30 and pressed firmly down therein to the position shown in FIG. 4, noting that the tab 50, including the ends of conductors 48 thereon is firmly against the coating 16 of wires 14. Thereafter, through the application of heat as by ultraviolet energy or vapor phase heating, the solder coating 16 is reflowed to bond the wires 14 to traces 48.

Thereafter, the lid 20 carrying component 24 may be applied to compress connector 42 in the manner shown in FIG. 5 interconnecting the pads 26 to traces 48 and therefore interconnecting the component 24 to the leads 14. In the event that the component 24 needs replacing or repair, the lid 20 may be removed by spreading the projections 38 and removing and replacing the lid or a new lid. The invention concept can thus be seen to provide a disconnect feature that is relatively straightforward.

The invention contemplates that the interior cavity 32 of the housing may be filled with insulating material such as an insulating gel or the lid and housing may be sealed by adhesive, the application of ultrasonic energy or the like.

In one of the preferred embodiments, illustrated in FIG. 8, the invention also contemplates an embodiment wherein the wires 14 are coated as at 16 with a non-oxidizing material, such as gold over nickel coated onto the wires as by plating selectively at points along the cable, suitably stripped to expose the precious metal finish. In addition, the wires may be coated with a conductive ink or conductive adhesive. The type of elastomeric connector herein disclosed and referred to in the above-mentioned patent has been found to provide excellent interconnection of long life when used with gold finished contact pads on the traces 48 and on the pads of the component or printed circuit boards interconnected thereby. The present invention thus contemplates a non-solderable version as well as a solderable version.

Figure 6:
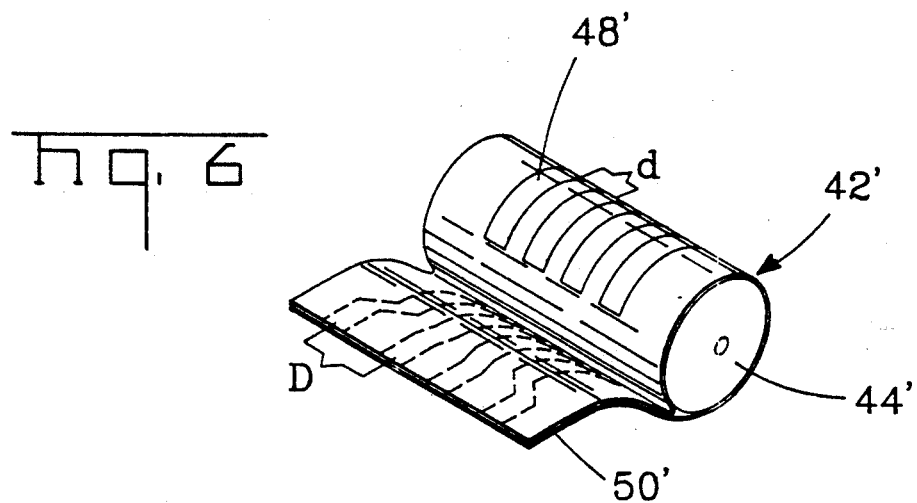
FIG. 6 is a perspective view of a connector in accordance with the invention in a further embodiment.

An alternative embodiment of the connector of the invention is shown in FIG. 6 to include a connector 42' having an inner resilient core 44' and a film 46' with conductive traces 48' carried thereon. In the embodiment in FIG. 6, the ends of the traces 48' shown at the top of the connector are spaced on a center-to-center spacing d' with the opposite ends of the traces 48' extending onto the tab 50' having greater spacings shown as D. A use of the connector like that shown in FIG. 6 would allow an interconnection to pads on very small centers and an interconnection to wires on larger centers, to facilitate a use of the invention where the dimensions of pads and wires need to be different. Alternatively, the center-to-center spacing of the ends of the conductive traces 48 may be reversed with the larger spacing on the top of the connector body, and the smaller spacing on the tab 50'.

Figure 7:
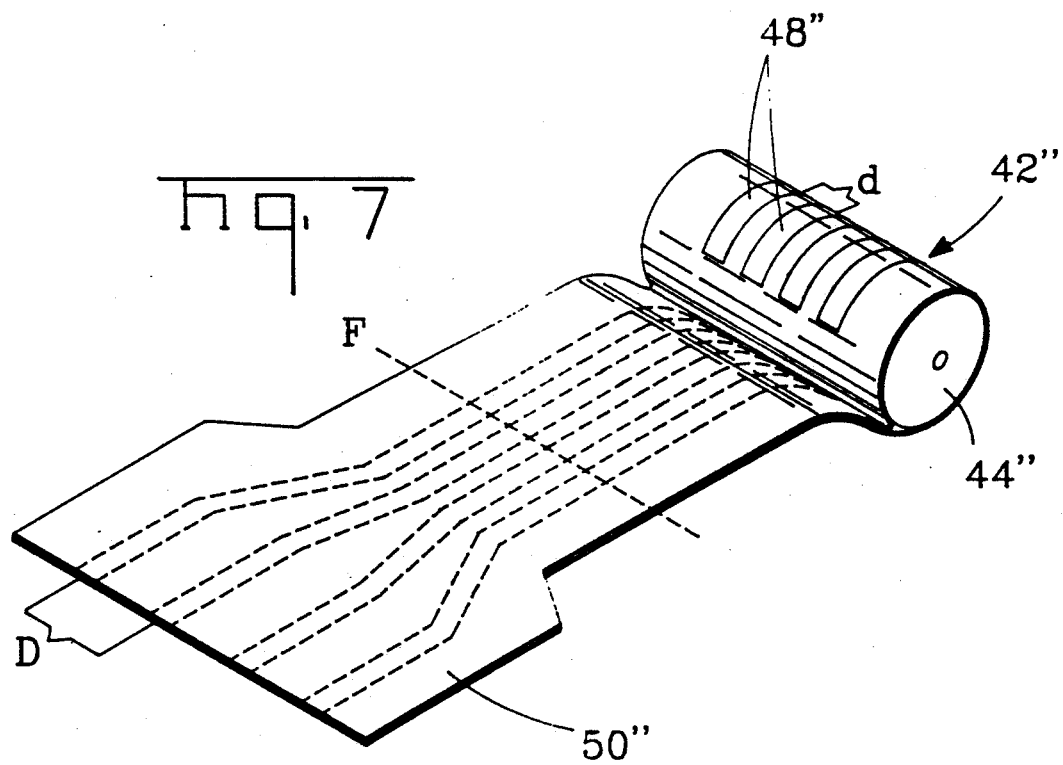
FIG. 7 is a perspective view of a still further embodiment of the connector of the invention.

FIG. 7 shows yet a further embodiment of a connector 42" having an extensive tab 50" including a tail extending well out away from the body of the connector 42'. As mentioned, the film of preference is an imide or a polyamid film that is quite flexible. The embodiment of FIG. 7 contemplates that the tab 50 may be folded as at the dotted line indicated F to present the traces 48" on tab 50" at right angles relative to the row of traces 48" on the connector main body.

The invention contemplates uses as outlined in interconnecting components to wires but further, in one aspect, an interconnection of flat, planar shaped conductive pads to wires of a cable that may have a variety of shapes, round or rectangular in cross-section, solid or stranded, including both the solder version, conductive ink and conductive adhesive versions, and the precious metal version. Also, the invention contemplates providing solder on the traces reflowed to interconnect the wires which may be tin coated.

Having now disclosed the invention relative to the specification and drawings, claims are appended intended to define what is believed to be inventive.

We claim:

1. An electrical connector for interconnecting the conductive pads of a component to the conductive wires of a cable, including a planar substrate forming the lid of a housing with an electrical and conductive pads mounted thereon, the pads extending in an array on first centers, a housing including a cavity having a floor, including means to receive and position wires of a cable in an array on second centers, an elastomeric connector fitted in said cavity including a resilient core carrying a thin, flexible dielectric film thereon having conductive traces in an array extending on said first centers proximate said pads and on second centers proximate said floor and wires with means affixing said lid on said housing to compress said elastomeric connector within said cavity and interconnect the said pads to the traces and the traces to the said wires to effect said interconnection.

2. The connector of claim wherein said means comprises latches to join said lid to said housing.

3. The connector of claim 1 wherein said wires include a coating of reflowable material to allow soldering of the said wires to the said traces.

4. The connector of claim 1 wherein said traces include reflowable material to allow the soldering of the traces to the wires.

5. The connector of claim 1 wherein said wires and traces each include a non-oxidant coating to allow a pressure interconnection of the said wires to said tracings.

6. The connector of claim 5 wherein said coating may comprise a conductive ink or conductive adhesive.

7. The connector of claim 1 wherein said first and second centers are the same.

8. The connector of claim 1 wherein said first and second centers are different.

9. The connector of claim 1 wherein said elastomeric connector includes a tab comprised of an end of said film extending slightly away from the core of the connector with said tab carrying said traces on said second centers.

10. The connector of claim 1 wherein said elastomeric connector includes a tab having a tail extending from the said core a distance many times the diameter of said core.

11. The connector of claim 1 wherein said film includes an end extending away from said core and adapted to be folded to reverse the position of said traces.

12. An electrical interconnection including conductive pads of a planar configuration and discrete conductive wires of a cable, an elastomeric connector having a resilient core and a flexible film carrying conductive traces extending over surfaces of said film between at least two spaced apart portions, means driving said pads to engage at least one portion of said traces to compress said core and provide an electrical interconnection between said pads and said traces, said driving means forcing another portion of said traces against said wires, thereby electronically connecting said pads to said wires.

13. The interconnection of claim 12 including solder adapted to be reflowed to join said traces to said wire.

14. The interconnection of claim 12 including non-oxidant coating of said second portion and of a segment of said wires with the said means driving said pads compressing said core to drive said second portion of said traces against said wire.

15. The interconnection of claim 12 wherein said means driving said pads is a plastic lid adapted to carry a component thereon joined to said pads.

* * * * *